(12) United States Patent
Thomas

(10) Patent No.: US 7,149,125 B1
(45) Date of Patent: Dec. 12, 2006

(54) LOCATION-SPECIFIC NAND (LS NAND) MEMORY TECHNOLOGY AND CELLS

(76) Inventor: Mammen Thomas, 1081 Corvette Dr., San Jose, CA (US) 95129-2906

( * ) Notice: Subject to any disclaimer, the term of this patent is extended or adjusted under 35 U.S.C. 154(b) by 0 days.

(21) Appl. No.: 11/334,790

(22) Filed: Jan. 19, 2006

Related U.S. Application Data

(62) Division of application No. 11/174,333, filed on Jul. 5, 2005, now abandoned.

(51) Int. Cl.
*G11C 11/34* (2006.01)
(52) U.S. Cl. .............................. 365/185.28; 365/185.18
(58) Field of Classification Search .......... 365/185.28, 365/185.18, 185.24, 185.27
See application file for complete search history.

(56) References Cited

U.S. PATENT DOCUMENTS 5,874,760 A * 2/1999 Burns et al. ................ 257/315
6,845,042 B1 * 1/2005 Ichige et al. ........... 365/185.17

* cited by examiner

*Primary Examiner*—Vu A. Le

(57) ABSTRACT

The use of a Nitride layer or a silicon-nodule layer capable of Location-Specific (LS) charge storage, allow easy vertical scaling and implementation of NOR and NAND NVM array and technology. If the charge is stored in the traps in the Nitride storage layer, a Oxide Nitride Oxide is used as the storage element and if charge is stored in potential wells of discrete silicon-nodules, or Carbon Buckyball layers, an Oxide silicon-nodule Oxide storage element, or an Oxide Buckyball Oxide layer is used as the storage element.

The problem of Location-Specific NAND memory is the inability to erase the cells with repeatable results. A novel erase method, Tunnel Gun (TG) method, that generate holes for consistent erase of LS storage elements and typical NAND Cells that erase by the disclosed method and programmed by either by Fouler-Nordheim (FN) tunneling or Low Current Hot Electron (LCHE) method are disclosed.

15 Claims, 4 Drawing Sheets

Prior Art MNOS**

Prior Art SONOS**

Prior Art NROM (Mirror Bit cell)

Mirror Bit Cell

LSN1 Cell
LS-NAND with FN program and TG erase

LSN2 Cell
With LCHE program and TG erase

LOCATION-SPECIFIC NAND (LS NAND) MEMORY TECHNOLOGY AND CELLS

CROSS REFERENCE TO PRIOR APPLICATION

This application is a division of Ser. No. 11/174,333 filed on Jul. 5, 2005 now abandoned

FIELD OF INVENTION

This invention relates to the structure and method of Programmable/Erasable Non-Volatile Memory cell technology for data storage applications.

1. Background

Data storage in discrete locations in non conducting traps in Silicon Nitride layers or in barrier isolated potential wells in silicon nodule layers and carbon Buckyball layers, have been considered possibilities for non Volatile applications instead of the typical floating gate made of poly-silicon, for vertical scaling of the Non-Volatile Memory cells. These cells are called Location-Specific (LS) Charge storage cells as the charge is stored in discrete isolated traps or discrete potential wells in specific locations in the storage element and does not spread during operation. The problem has been mainly the erase of these cells, typically they require high voltages to be applied to the junctions and the wells to erase these types of cells as extracting charge from traps or potential wells completely is difficult. In addition high tunnel voltages will cause reverse tunneling which can cause charge to be re-stored. Alternate erase methods using Band to Band tunneling, where in holes generated are used to erase the electron charge, used in the mirror bit cells are making the LS storage more mainstream. But the erase limitations have prevented the LS storage structures from being used in NAND cell architecture effectively. The current discussion in the disclosure will be focused on the Nitride layer for storage element, but the Silicon nodule layer and the carbon Buckyball layer can replace the Nitride layer and operate in a similar fashion in the cells described. In the past the high voltage needs and difficulty of erase have limited the scalability of these discrete Location-Specific storage cells and made the poly-silicon floating gate cell the primary contender for Non-Volatile memories. As the process development has matured and technology has scaled to smaller and smaller dimensions, the poly-silicon cell has approached its scaling limitations. This has re-kindled the interest in the Location-Specific storage cells. In order to scale these cells it is necessary to remove the high voltage requirements that limit scaling of the memory junctions and isolation. In addition to allow NAND cell structures to be implemented using these LS elements it is necessary to have a good erase method that allow the cells to be effectively erased as a page, a block or a sector.

As explained the prior art method of erase of an NROM cell was by application of very high voltages to cause Fouler-Nordheim (FN) tunneling from and to the discrete storage locations. Due to the non-conductive nature of the storage layer and associated storage element, tunneling of carriers, typically electrons, can take place in both directions if sufficient voltage is applied across the storage element. Hence the traps can get filled by carriers moving in either direction. The FN tunneling erase in the past has relied on the location of storage in the storage element to help the erase of the cell. This has not been a very repeatable and manufacturable process and has limited the use of LS storage cells from becoming a mainstream non-volatile memory technology. The recent mirror bit technology on the other hand uses channel hot electron (CHE) generation to program using high currents and band-to-band tunneling at the high-doped junction to supply carriers of the opposing type (holes) to neutralize the stored charge and hence erase the cell. A unique method for moving charge into the Location-Specific storage cells for erase is described and some possible cell structures, using this method, are presented. The erase method proposed is the Tunnel Gun (Tun-Gun or TG) method (U.S. Pat. No. 6,479,863 B2, U.S. Pat. No. 6,384,816 B1, and U.S. Pat. No. 6,534,816 B1), which are herby incorporated by reference, for transferring charge into the storage element or storage layer. This is a medium or voltage method, where the voltages are applied to the gate structure of the TG structure and can be implemented in a number of ways to facilitate an efficient and scalable Non-Volatile memory cell.

2. Prior Art

Nitride has always held an attraction as a storage element from the early days of Non-Volatile memory due to its capability to accumulate and store charge in the inherent traps that exist in the film. Early efforts at nonvolatile memories using Nitride films are the Metal-Nitride-Oxide Silicon or MNOS structure and the Silicon-Oxide-Nitride-Oxide-Silicon or SONOS structure. The MNOS structure is shown in FIG. 1, and the SONOS structure is shown in FIG. 2. The difference between these structures is how the gate stack is formed over the channel. The MNOS device uses a gate stack comprising a thin Oxide (4), a Nitride storage layer (6), and a Metal layer (9) directly over the Nitride layer, in that order, all residing over the silicon device channel (3) in a Silicon Substrate (5) forming a Metal-Nitride-Oxide-Silicon (MNOS) structure between the Source (1) and Drain (2) diffusions of a semiconductor device. The SONOS device uses a gate stack comprising of a thin Oxide layer (4) on Silicon (5) over which is the Nitride storage layer (6), a second Oxide layer (7) on the Nitride layer and a Poly-Silicon layer (9a) on top, forming the Poly Silicon-Oxide-Nitride-Oxide-Silicon (SONOS) structure between the source (1) and drain (2) diffusions of a semiconductor device.

Typically these devices have been programmed by FN Tunneling, enabling the electrons to get in and get trapped in the Nitride by directly applying a high voltage across the dielectric stack between the top conductor and the bottom silicon to produce a voltage gradient across the insulator to cause carriers to move into the Nitride. Similarly the erase was by application of a reverse high voltage sufficient to cause the carriers to move out of the traps into the channel. It has been seen that the complete removal of charge stored in the Nitride is difficult if not impossible by application of high voltages, even with adjustment of the trap location in the Nitride close to the silicon substrate. Due to this reason of difficulty in erasing the cells the cells were never mainstream non-volatile cells used in NVM applications.

Further development of the Nitride based storage has been on hold or on low key due to the development and commercialization of the well known easily manufacturable standard floating gate Non Volatile memory where the charge is stored in the floating gate of the memory. The cells in this category include the EEPROMs, the EPROMs and the Flash memory cells of today. These types of memories have been more robust and controllable during program and erase operations and highly reliable in the technology nodes up to 0.13 micron.

As the technologies are being scaled to achieve smaller dimensions and larger densities per unit area, the standard Floating gate Nonvolatile memory is reaching a non scalable region due to the poly silicon height and the oxide thickness necessary as well as the voltages needed for program and erase. This in turn has re-kindled an interest in the Nitride storage cell. The standard SONOS Nitride cells have re-emerged with Channel Hot Electron at a junction as methods for programming and Band to Band Tunneling erase as candidates for memory cells of the NOR type or even MLC type. The advantage of the CHE program is that it limits the accumulation of charge to a very small area near the drain of the programming device. As the charge does not spread by conduction in Nitride but remains localized, the read has to ensure that the drain depletion region does not cover the charged area of Nitride during read. Hence a reverse read with the programming drain used as source is generally done for this type of cells. For erase of these cells a negative gate with a high voltage on drain is used to generate hot holes by band-to-band tunneling. These holes that are generated close to the drain depletion are used to erase the charge accumulated during program. The use of these not well controlled phenomena requires critical drain engineering for program and erase to happen at the same location, so that the localized trap storage locations can be erased by the hole charge neutralizing the electron charge. The technology hence is very complex and costly. In addition the multiple voltages required to be applied on the junctions are not those that are typically used for that specific technology node.

May be the most promising prior art development using these program and erase methods is the Nitride Mirror bit cell, which can be implemented as a single bit NOR or two bit MLC cell shown in FIGS. 3 and 4 with CHE programming and band to band tunneling generated holes for erase. This is a multi-bit cell that is capable of storing charge at both ends of the Nitride layer at locations shown (10 and 11) in the Nitride film (6). During programming of bit 1, a high voltage of the order of 5 V is applied to the first diffusion, drain, (1) with a high voltage of the order of 11V to the poly gate (9) and ground to the second diffusion, source, (1a). This causes a high current flow with impact ionization due to hot electrons at the drain junction. A small portion of the generated CHE will have the velocity component to overcome the barrier of Nitride, resulting in programming by accumulation of negative charge in the traps in the nitride film (6) at storage location (10). Similarly by reversing the diffusions used for source and drain during programming will cause bit 2 to be programmed at location 11. The read of the bit 1 is done with diffusion (1), as source, and diffusion (1a), as drain, so that the location 11 is covered by the depletion region while location 10 is in the channel modulating it and can be read back. Similarly bit 2 is read by reversing the drain and source that is with drain (1) and source (1a).

More important is that the mirror bit has solved the problem of prior art cell erase using Band to Band (b—b) tunneling at highly doped junctions to generate the opposite type of carriers or holes that are then pulled into the storage layer using the high energy they already have plus additional voltage gradient applied across the ONO layer such that the electron charge stored is neutralized and positive charge is stored instead in the traps. The operation is as follows; If location 10 is to be erased a high voltage, typically in the 7V to 10 V range, sufficient to cause band to band tunneling at the highly doped reversed biased junction is applied to the diffusion region (1) with a negative voltage, typically 1V to 3V, to the poly-silicon gate (9) which keeps the channel in the off state and provide a potential gradient that attracts the energetic holes generated, into the storage element to get colleted and neutralize the charge in the Nitride traps at the location near the generation point and charge it positive. Since the channel is in the off state no channel current flows and the junctions (1) and (2) are isolated. This allows both the locations (10 and 11) to be simultaneously erased if so desired. A block of memory can be erased using this method at the same time allowing for block erase.

It is to be noted that the mirror-bit cell with the CHE program at the junctions and the Band to Band tunneling also at the junctions used to generate holes for erase does not lend itself to the NAND structure as it needs high voltage application to the reverse biased junctions for both program with hot Electrons and erase by generating holes. Since in a NAND structure a cell has multiple storage gates, each having its own storage element that are arranged in series across a source and drain, it is not possible to apply the necessary voltage to the junctions adjacent to each of the storage elements to cause CHE programming or B to B generation of holes very effectively.

Some of the problems that exist with the current Nitride or LS cells include:

1. Though programming can be with FN tunneling it is difficult to erase the cells with FN tunneling.
2. CHE allows two-bit storage in a mirror bit cell, which will not be possible with FN tunneling programming.
3. B-to-B erase is not suitable for erasing a NAND structure, thus providing no suitable erase capability for a NAND structure with Location-Specific storage elements.
4. The voltages required on the junctions and well of the devices are large for the program or erase or both causing cell to cell separation or isolation to be larger than minimum.
5. The high junction voltages also have the problem of increasing the channel lengths of the devices to eliminate punch through and leakage effects. The devices sizes are hence larger than minimum.
6. Junctions have to be made deep to withstand very high voltages without breakdown; this is counter to what is suitable for scaling.
7. Drain engineering is a complex process for these high voltage junctions.
8. It is made more complex by the need for Location-Specific program and erase when hot electron programming and B and-to-Band tunneling erase are used.
9. High currents are needed to achieve the CHE program at the junctions, as the collection efficiency is small.
10. The devices are slow to write. (Program-erase cycling)
11. The high current and high voltages translate to high power dissipation during program and erase.
12. Need for high voltage devices in the data path tend to limit access speed.
13. High process complexity and circuit complexity due to multiple voltage levels and polarity needs.
14. The necessity to ensure that the cells do not over erase, causing unselected cells to conduct during read, make the circuitry for program-erase complex.

What is Proposed

The one major impediment to the development and implementation of the LS memory has been the difficulty in erasing the cells consistently. The Band to Band Tunneling generation of holes for erase of the LS memory cell is a difficult process to optimize and it does not allow itself to be used in LS NAND structures. The current disclosure provides a means for erase of the memory cells in a consistent manner using the TG method for generating high energy carriers of the correct polarity that can be used to erase a LS storage element or cell. The disclosure also provides for programming a LS NAND cell using a Low Current Hot Electron Method that is faster and is at a lower voltage than the FN tunneling method, or the Channel Hot Electron method used in the prior art cells.

The current disclosure provides a cell erase method for LS memories that generate holes that can be used to erase a LS non-volatile memory cell. This disclosed method that uses the Tunnel-Gun structure, similar to an MIM diode to generate high energy carriers of the right polarity and decouple the program and erase operations so that each can be optimized independent of the other unlike the mirror bit cell where the optimization of one impact the operation of the other as both the program and the erase operations depend on the structure and doping of the drain junction. The disclosed erase operation enable the use of LS cells efficiently in the NAND architecture, which was not possible in the past with the B-to-B erase used in the mirror Bit implementation. Hence this erase method allows implementation of the erase of LS memory elements in all memory architectures like NOR, NAND and others being used today with minimum restriction.

The Location-Specific storage cells disclosed typically have the charge stored in traps in the Nitride layer of an Oxide Nitride Oxide (ONO) storage element or in the discrete potential wells of a silicon-nodule layer of a Oxide silicon-nodule Oxide (OsnO) storage element or in discrete potential wells of Carbon Buckyball layer of an Oxide Buckyball Oxide (OBO) storage element. The operation of these cells are similar and the storage elements can be replaced in the cells without impacting the operation as will be clear to individuals conversant with NVM technology. The detailed operation and descriptions of the cells are provided using the ONO storage element. It is assumed that the other storage elements mentioned, and other similar ones that may become available in future, can replace the ONO layer under the similar operating conditions.

The programming of the LS based cells can be done in two ways. One is by application of a high voltage of the correct polarity across the storage element, by applying a voltage to the control gate to cause FN tunneling of carriers through the storage element resulting in the carriers accumulating in the charge traps or potential wells of the storage layer. This type of storage causes the whole storage element to be charged, negatively as the voltage exists across the element. Alternately a Low-current CHE (LCHE) with a select/program gate can be used to achieve carrier trapping in specific location in the storage layer. In the case of FN tunneling the traps across the storage layer will be filled while the LCHE method allows charge trapping only in and around the high field region generated by the applied voltages as the storage layers are non-conducting layers. The FN tunneling method is a very low current, high voltage method of programming the cell while the LCHE method is a low current method that uses lower high voltage values for programming the cells.

In the case of LS memories the erase in the past has been the more difficult, and limiting operation. The early erase for these cells was by FN tunneling. FN tunnel erase of the LS cells require a very high voltage gradient to be applied across the storage element in the reverse direction. This can cause carriers to tunnel across the storage element from the opposing electrode resulting in no erase or incomplete erase. The requirement in these cells was that the storage or trap location be as close to the channel or erase electrode as possible allowing the charge to move out with the application of voltage. Making sure that the traps exist closer to the interface consistently has been a difficult if not impossible requirement in manufacturing and this has been a problem with LS storage cells, especially Nitride based storage cells. In addition having low thickness barrier to channel has the disadvantage of limited charge retention, resulting in low reliability of memory. These issues of reliability and manufacturability have kept the prior art LS Nitride cells from becoming mainstream non-volatile storage cells.

The best way to erase the charge in the LS storage element is by supplying opposing polarity charge which is then attracted to the storage locations and neutralize the stored charge while filling the storage locations in the storage layer with the opposite charge (typically positive charge). The use of the Band-to-Band (B-to-B) Tunneling erase in the case of prior art mirror bit cell is one such implementation of that method of erase. Though the Mirror-bit cell provides a reasonable erase method, it by the complexity of drain design, make manufacturing and yielding of the technology difficult. The program and erase in this case are accomplished by the high fields that are generated at the drain junction. First, the program, with a high current flow to generate hot electrons by impact ionization at the depletion region of the drain, where part of the generated electrons are accelerated into the traps in the Nitride by suitable voltage applied to the gate electrode. Second, the erase, with high field induced band-to-band tunneling to generate hot holes that are pulled in to the traps, also by suitable voltage applied to the gate electrode, to cause erasure of the stored electron charge.

Since the program and erase use high voltages applied to junctions, this type of program using CHE generation and erase using B-to-B hole generation is not easily suited for NAND operation. Typical NAND structures in silicon are used with FN tunneling for program and opposite direction FN tunneling for erase, which combination is not suitable for LS based cells as already explained.

What is disclosed is the TG method for generating high-energy carriers that can be used to achieve the erase operation of a LS storage cell and array. This type of erase is not associated with the junctions and is de-coupled from the underlying cell structure and the program process, allowing it to be used in NOR, NAND, and other types of memory architectural implementations to erase a storage element or a memory cell. The TG method for injecting and accumulating or neutralizing the existing charge in the traps in an ONO storage element or the potential wells in a OsnO or OBO storage element used in an LS storage cell is based on a non-traditional use of a structure similar to MIM diode, where the collector electrode is thinned down sufficiently to act as a sieve or grid. This forms a diode with a conducting tunneling injector or injector electrode, a thin barrier, and a conducting collector electrode, together operating as a Tunnel-Gun (TG) and is described for application in floating gate structures in "Method and apparatus for injecting charge into the floating gate of a non-volatile memory cell" U.S. Pat. No. 6,534,816, U.S. Pat. No. 6,479,863, and "Method and apparatus for injecting charge into the floating gate of a non-volatile memory cell" U.S. Pat. No. 6,384,451 and co-pending applications by the applicant "CACT-TG (CATT) low voltage NVM cells", application Ser. No. 11/037,742 filed on Jan. 18, 2005, all of which relate to poly-silicon floating gate structures and "Nitride Storage Cells with and without select gate", application Ser. No. 11/068,218 filed on Mar. 1, 2005, relating to LS storage structures, all of which are incorporated here in by reference. The current application is for memory cells, especially NAND cells using LS storage layer to store charge in a storage element, which can be ONO, or OsnO, or OBO storage elements. The cells use a conductive injector layer or injector electrode (injector), that is typically a metallic layer, a silicided poly-silicon layer or a doped poly-silicon layer, which has relatively large concentration of free carriers of the correct type for injection. In the case of the typical memory cell where the program is by accumulation of electrons, the TG injector electrode has a high concentration of holes. These carriers are provided enough potential energy by a voltage gradient applied across the injector electrode and the conducting collector electrode (it can be referenced as "grid collector", "grid electrode", "collector electrode" or "collector"), across the thin barrier layer separating them. This potential gradient is made sufficient to cause tunneling of carriers through the thin barrier material, typically Silicon dioxide or Aluminum oxide of typical thickness in the range of 15 to 60A, separating the injector electrode from the collector electrode. The collector electrode is typically made of a metallic layer, a silicided poly-silicon layer or a doped poly-silicon layer. The typical thickness of the collector electrode is less than the mean free path of the carriers that tunnel through the barrier with high energy and enter the collector, the typical thickness being in the range of 100 and 350A. The thickness of the collector is adjusted such that a portion of the carriers, that tunnel across the barrier, with the high-energy, pass through the grid formed by the collector electrode and enter the top barrier layer of the LS storage element, over which the TG stack resides. This layer is the one that protects the storage layer from inadvertently loosing data. If the potential across this barrier, and the storage element is in a direction to accelerate the carriers towards the traps or potential wells that exist in the layer, it will move towards them and get collected. This will neutralize the stored charge in the storage layer and cause the element to be erased. In the case of a NOR cell where there is only one element per cell the cell will be erased as described above. In the case of a NAND cell only the selected element or elements will be erased at a time.

Note that it is also possible to use this method to selectively program or erase the storage elements. The TG can be made to inject electrons or holes based on the injector electrode used and the voltage polarities applied.

During use or the TG to erase or program a memory element, if the field applied across the storage element from the silicon surface to the collector electrode is in the opposite direction, that is in a direction to retard the high energy carriers passing through the collector, these carriers will fall back into the collector electrode and get collected by it causing no change in the charge in the storage layer.

In this current disclosure the TG based erase can be used in combination with any programming method to implement P-channel or and N-channel LS storage cells. Especially applicable is the erase of LS-NAND storage cells with multiple storage elements in series over a single channel as is well understood in the industry. Presently there is really no method for erase of the Location-Specific NAND structure that is reliable and manufacturable. This disclosure provides that capability.

The Objects and advantages of the LS NAND structure disclosed with the FN program or the Low Current HE program combined with TG erase for a Location-Specific storage cell are:

What is proposed is the use of methods for programming and erase of the LS storage cells, such that the storage elements can be implemented in a NAND cell and we can eliminate the disadvantages of the prior art.

Some advantages of the disclosed method and implementation include:
1. The use of TG method for erase enables the LS storage elements to be erased by neutralizing the stored charge in the storage element.
2. The TG method of erase can be used efficiently in NAND cell architecture.
3. The disclosed methods reduce the overall voltages on the junctions and wells needed for erase.
4. The only terminal that will see any high voltage during erase are the Tunnel Gun electrodes, or TG stack, which together form the control gate.
5. Over all reduction of high voltages applied to cell diffusions allow shrinking of the cell sizes.
6. Drain engineering is simpler as the programming and erase need not be simultaneously optimized for using high drain voltages at the storage location.
7. Process complexity is reduced due to lower voltage operation
8. High-speed program and erase operation is possible.
9. TG has the ability to inject either types of carriers, electrons or holes, into the floating storage node depending on the type of device and the associated voltages.
10. Memories can be implemented as either N-channel or P-channel cells.
11. The lower voltages in the system allow scaling in the horizontal and vertical directions.
12. Thinner storage element allow vertical scaling of cells
13. Process steps are those currently in use and do not need to be developed uniquely for the cell.
14. TG stack processing can be easily integrated into the semiconductor process.
15. Power dissipation is reduced as both program and erase are tunneling based, and erase is a lower voltage operation using TG than in the current FN tunneling devices.
16. The scaled cells enable large arrays to be implemented.
17. Self-limiting nature of the Program and erase can be used for implementing multilevel cells.

DESCRIPTION OF DRAWINGS

FIG. 5 LSN1 Cell (Location-Specific NAND Cell With FN Tunneling Program and TG Erase)
1. P-well
2. Drain Diffusion
2x. Source Diffusion
3. Isolation oxide
4. Drain select gate channel
4x. Source select gate channel
5. Drain select gate oxide
5x. Source select gate oxide
6. Drain select gate poly-silicon or Drain select control poly-silicon
6x. Source select gate poly-silicon or Source select control poly-silicon
7. Inter-gate diffusion
8. Channel under storage element
9. First Oxide, over the channel (8), of the Storage element
10. Storage layer (Nitride layer or Silicon-nodule layer or Buckyball layer)
11. Top protection barrier, or top barrier oxide, or second Oxide, on the surface of the storage layer (10)
18. Bottom conductive collector electrode forming a grid layer of the TG structure and control gate
19. Barrier layer of the TG structure
20. Top conductive injector electrode or injector of TG structure and control gate A1 and A2. Seletect Gates
B1, B2, B3, and B4. Storage elements
  Note: The conductive layers of the TG stack when kept at equal potential or shorted together act as the control gate electrode of the storage gate.

DESCRIPTION OF THE INVENTION

The current disclosure of LS based NAND cells are explained using two separate types of NAND cells. The difference between the two is in the programming method used. The cell shown in FIG. 5 uses FN Tunneling for programming the selected storage gates, while the cell shown in FIG. 6 uses Low-current Channel Hot Electron for programming the selected storage gates. In both cases the cells or arrays are erased using the TG to generate and supply the carriers, typically holes to neutralize the stored electron charge of the cell.

Figure 1:
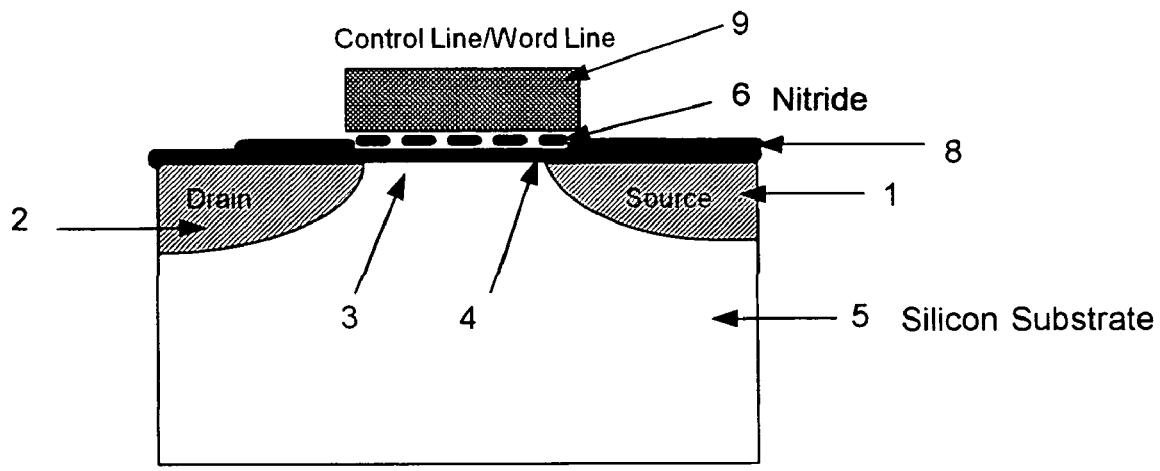
FIG. 1 Prior Art MNOS memory cell.
Figure 2:
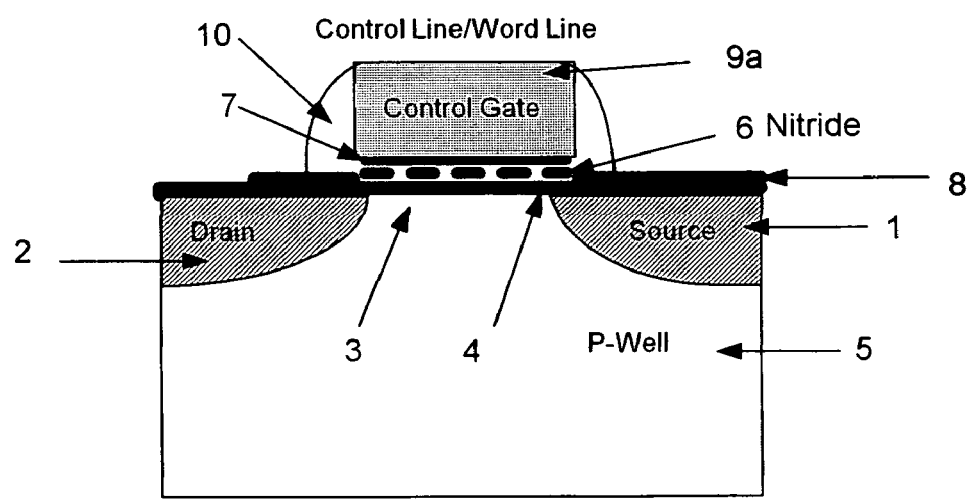
FIG. 2 Prior Art SONOS memory cell.
Figure 3:
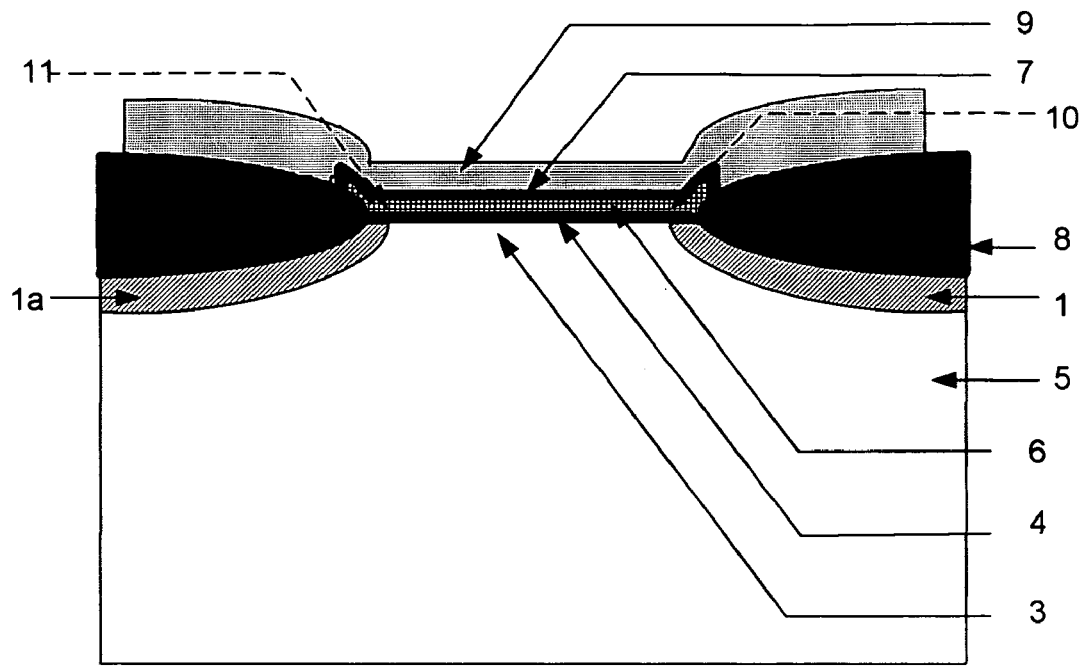
FIG. 3 Prior Art NROM (Mirror Bit) cell CS along diffusions.
Figure 4:
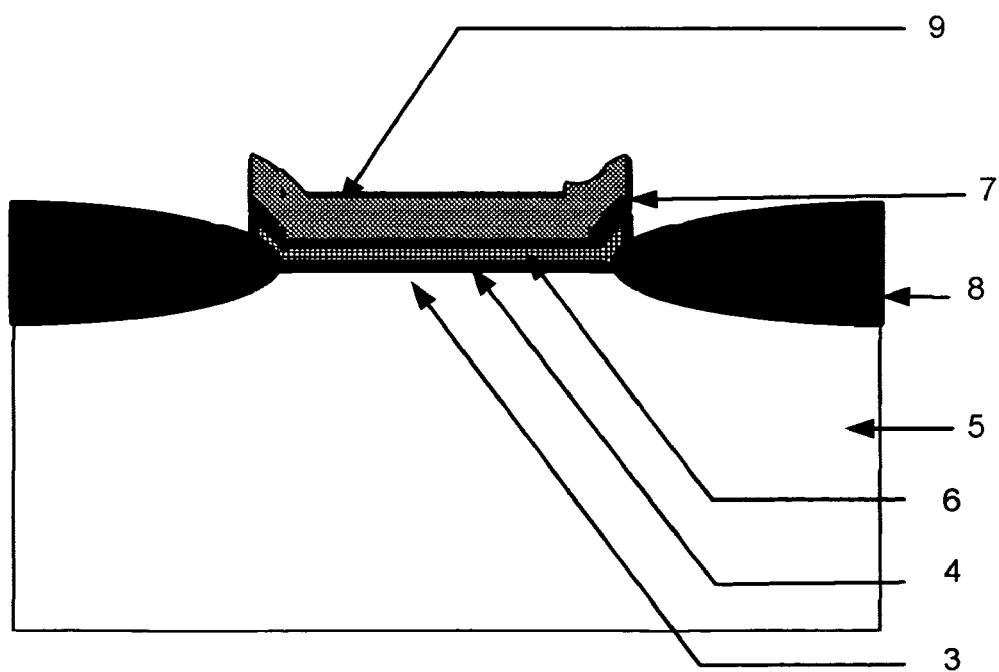
FIG. 4 Prior Art NROM (Mirror Bit) cell CS perpendicular to diffusions.
Figure 5:
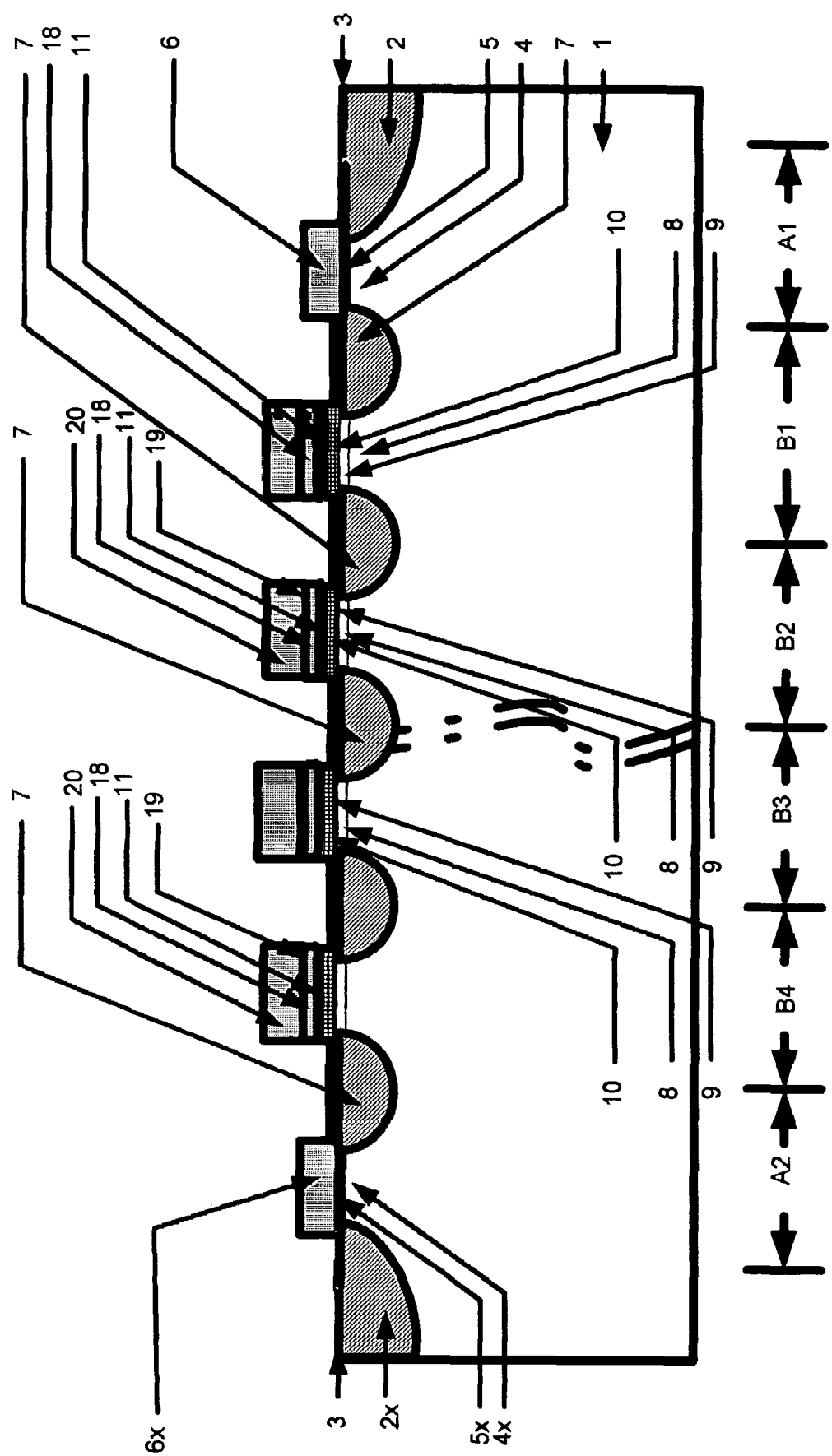
FIG. 5 LSN1 Cell—LS-NAND with FN program and TG erase
FIG. 6 LSN2 Cell—NAND with LCHE program and TG erase EXPLANATION OF NUMBERING AND LETTERING IN THE FIGURES FOR TYPICAL IMPLEMENTATION OF THE TECHNOLOGY FIGS. 1 and 2 of Prior Art.
1. Source Diffusion
2. Drain diffusion
3. Channel in P well
4. Silicon Dioxide on well
5. P-well
6. Nitride storage layer 7. Oxide layer on the storage layer
8. Isolation oxide
9. Control gate Metal line/word line (for MNOS device)
9a. Control gate Poly silicon/word line (for SONOS device)
10. Sidewall oxide FIG. 3 & FIG. 4 of Prior Art
1. Source/Drain diffusion 1
2. Source/Drain diffusion.2
3. Channel of the storage device
4. Oxide on Well silicon
5. P-Well
6. Nitride Storage layer
7. Oxide on top of Nitride
8. Isolation oxide
9. Poly-silicon word line/control gate poly
10. Location of Bit 1 storage
11. Location of Bit 2 storage
  Note: The cell stores two bits at two locations in the storage element ONO layer (made of 4, 6, and 7)

In the first instance, FIG. 5 is a NAND cell, which is programmed by FN tunneling and erased by TG method. The NAND cell shown comprises of four storage gates or segments (B1 to B4) and two select gates (A1 and A2) that help isolate the cell if it is not a selected cell in the array. The four gates are shown as example and should not be construed as limiting the number of gates that can be implemented in the cell. The storage gate number can be increased to store more bits of data in the cell. The limiting factor is more the sensing of the state of data as the series impedance of the cell increase with larger number of storage elements in the cell.

An array of storage cells can be implemented to enable the cells to operate as a memory. An isolation oxide (3) enable the isolation of any cell from the neighboring cells during the operation of a memory array as will be well known to those who practice the art.

Each cell comprise a number of storage gates (B1 to B4) deposed on the silicon, with two select gates (A1 and A2) that are also deposed on silicon all being typically a P-well. The gates are separated by inter-gate diffusion areas (7) that provide electrical connection between channels in silicon, under the gates, providing for an integrated channel between a source diffusion (2x) and a Drain diffusion (2). The drain select gate, comprising, a drain select channel (4), a drain select gate oxide (5) and a drain select gate Poly-silicon (6) and source select gate comprising, a source select channel (4x), a source gate oxide (5x) and a source select Poly-silicon, that separate the storage gates from the respective Drain and Source junctions enable isolation of the un-selected cells during program, erase and read operations.

Each storage gate capable of modulating a channel (8) in silicon (1) over which it is deposed. The level of modulation will depend on the type and magnitude of charge stored in the storage gate. The storage gate is made of a storage element on silicon over which is deposed the TG Stack which also acts as the control gate.

The Storage element comprise three components, a dielectric layer, typically a Silicon Dioxide or Silicon OxyNitride layer, on silicon, which form the gate dielectric (9), a storage layer, typically a Nitride or a silicon Nodule or a Carbon Buckyball layer that have discrete traps or discrete potential wells that allow trapping and accumulation of charge (10) and a top dielectric, typically silicon Dioxide or Silicon OxyNitride that protects the storage layer (11). Hence the storage element can be an ONO structure, where the storage will be in traps in a Nitride storage layer, or an OsnO structure where the storage will be in discrete potential wells of a silicon-nodule layer, or an OBO structure, where the storage will be in discrete potential wells of a Buckyball layer. The O in the ONO, OsnO and OBO storage structures denote the barrier layers that sandwich the storage layer and are used to protect the stored charge from leaking out by providing a sufficiently large barrier layer. Typical thickness of the barrier layer on silicon is between 20 and 70 A, and the one on top of the storage layer is of the order of 30 to 150A. The storage layer thickness is dependant on the charge that has to be stored and if the cell is a Multi-bit cell or a single bit cell, typical storage layer thickness are in the 10 to 120A range.

The TG stack that overlies the storage element is formed of a collector electrode or grid electrode (18) having a thickness that is substantially smaller than the mean free path of the carriers in the material, typically in 50 to 350 A range over which is deposed a thin barrier material (19) of thickness 15 to 60 A that separate a conductive injector electrode (20) from the grid electrode or collector electrode.

Operation of the Cell

In a typical NAND operation all the stored data, in the chosen NAND cell or cells in an array, are first erased by generation of holes using the TG structure and then data is programmed into the storage locations of the cell selectively using FN tunneling. Operation of a single cell is explained below.

In the typical operation, the channel (4x) of the source select gate (A2) is turned on by applying a voltage to the source select control poly-silicon (6x) with the source diffusion (2x) at ground potential. The channel (4) of the drain select gate (A1) is kept in the off condition by grounding the drain select control poly-silicon (6) which isolate the drain diffusion (2) from the storage elements and makes the state of the drain diffusion a don't care condition during erase. The erase operation is conducted on all the storage gates of the cell at the same time by application of suitable similar voltages. A voltage is applied to the collector electrodes (18) of the TG stack of the storage gates (B1 to B4) that are to be erased, to create a drift field for holes across the cell storage elements by having a potential difference across the storage elements, from the collector electrodes to the channels (8) of the storage gates. Typical voltage applied to the collector electrodes is sufficient to turn on the channel underneath the storage gate, which then connects to the source through the on channel of the source select gate and is hence kept at ground potential. The typical value of voltage applied to the collector electrodes is in the 1 to 3 V range. A voltage is now applied to the injector electrodes (20) of the TG stack of 5.0 to 8.5 V such that the potential is sufficient to cause tunneling of holes from the injector electrodes (20) to the collector electrode (18) through the thin barrier (19) separating them. Part of the holes, or charge carriers, that tunnel through the barrier will pass through the thin collector electrode or grid layers, which have a thickness less than the mean free path of the charge carrier in the collector electrode material, without collisions and with sufficient retained energy, to over come the potential barrier of the barrier layer (11) that is the top layer of the storage elements. Since a drift field exist in the storage elements between the collector electrode and the channel, the charge carriers or holes, that over come the potential barrier and enter the barrier layer (11) over laying the storage layer (10) will tend to drift down into the storage layer and get trapped in the discrete traps of the ONO or the discrete potential wells of the OsnO or the OBO storage layer that is used for the LS storage element. Any charge carriers that are not collected by the storage layer will drift through the gate dielectric layer (9) under the storage layer, forming the bottom protective barrier layer of the storage element and will be collected by the channel. Since the stored charge during erase is positive, the channels of the storage gates will be turned on after an erase, that is an erased state in the storage gate will make the gate conduct.

Once the erase is done as described above it is necessary to program the cells with the correct data. As has been done for poly silicon memory cells it is possible to use the self coupling of the gate voltage to selectively write into the storage elements of the cell based on the input data. Assume that the storage element at storage gate (B2) is to be programmed. This is done based on the data to be stored, i.e. an erased state or a programmed state of the storage element, is defined by the voltage that exist at the drain of the cell. Since the cell is in the erased state, if the data to be stored is the erased state, the existing state of the cell has to be retained, and if the data to be stored is a programmed state, the existing data has to change.

During programming the channel (4x) of the source select gate (A2) is turned off by applying ground potential to the source select control poly-silicon (6x). The channel (4) of the drain select gate is turned on by application of a voltage in the range of 1 to 2 V to the drain select control poly-silicon (6). If the data to be stored requires that the erased state to be retained, a positive drain voltage, typically of 1 to 2V is applied to the drain and if the data to be stored require that a programming takes place then the drain of the cell is brought to ground.

A voltage sufficient turn on the storage gates B1, B3 and B4 is applied to the control gate electrode (18 and 20) of the un-selected storage gates and a high voltage sufficient cause FN tunneling is applied to the control gate electrode of the selected storage gate (B2), all the control gate electrode voltages being applied simultaneously. (The injector electrode and collector electrode of the TG stack kept at equal potential or shorted together, act as the control gate electrode of the storage gates during program.) Typical voltage on the control gate electrode of the un-selected storage gate will be in the order of 1.5 to 5V sufficient to turn on a programmed cell but not sufficient to cause programming in the un-selected storage gates and a high voltage sufficient to cause FN tunneling typically in the range of 5 to 12 V is applied to the control gate electrode of the selected storage gate. In the case where a positive voltage exists on the drain diffusion, the voltages applied to the control gate electrodes of the storage cells (B1 to B4) get coupled down to the channel of the storage devices and tries to bring the channel voltage high. If the channel (8) of the storage devices and the inter-gate diffusions (7) are sitting at a positive voltage close to that of the drain select control poly-silicon (6), from the positive voltage supplied from the drain (2), through the turned on channel (4) of the drain select gate (A1), then the coupled down high voltage is able to pull up the channel under the storage gates and hence the inter-gate diffusions (7) higher and causes the channel (4) of the drain select gate (6) to shut off preventing discharge of the coupled down channel voltage. This voltage that is higher than the applied drain voltage, appearing in the channel of the select device, will be sufficient to reduce the voltage gradient between the high voltage applied to the control gate of the selected storage gate and channel of the storage gate to a value less than that required to cause tunneling across the storage element and hence no change is the erased state of the cell will take place.

Alternately in the case where the drain diffusion (2) is at ground potential, the coupled down voltage from the control gate electrodes of the storage gates will not be unable to pull up the channel (8) under the storage gates (B1 to B4) and the inter-gate diffusions, as these will discharge to the ground potential through the channel (4) of the drain select gate (A1) which is in the on state. Hence the channel under the selected storage gate (B2) remain at ground potential, providing the voltage gradient due to the high applied voltage to appear across the selected storage element, causing FN tunneling to occur and the storage layer (10) to be programmed by accumulation of negative charge in the discrete storage locations in the layer. The unselected storage gates have a much lower voltage applied to the control gate electrode than is necessary to cause FN tunneling and hence will not accumulate negative charge during this selective programming step.

In the manner described above it is possible to selectively program or leave erased the storage gates of the cell based on the voltage applied to the drain diffusion of the cell. The voltage on the drain diffusion determines the status of the input Data to be programmed into the cell.

The typical voltages mentioned are provided for the technology nodes that are current today, that is up to 0.18 and 0.13 micron nodes. The cell is scalable to lower technology nodes and the voltages applied may have to be scaled with the technology.

In the second instance disclosed, the non-volatile memory cell is to be programmed by use of low-current Channel Hot Electron generation and accumulation in the storage element and erased by generation of holes by use of the Tunnel Gun (TG) and accumulation of the holes in the storage element. The cell, in FIG. 6 comprise of multiple, in this case four, storage gates (B1 to B4) as in the previous cell shown in FIG. 5. The inter-gate diffusion (7) in FIG. 5 is eliminated and instead select/program gates (C1 to C3) having a channel (4p) controlled by a Poly-silicon gate electrode (7) overlaying the channel and separated from it by a gate oxide (5p). The drain select gate (A1) comprising a channel (4) in P well which is controlled by a poly-silicon select gate electrode (6) that is separated from the channel by a gate oxide (5) is deposed between the drain diffusion (2) and the storage gate (B1), and the source select gate (A2) comprising a channel (4x) in P-well which is controlled by a poly-silicon select gate electrode (6x) that is separated from the channel by a gate oxide (5x) is deposed between the drain diffusion (2x) and the storage gate (B4). In this cell disclosed the erase is by generation of holes and collection of these holes by the LS storage layer and Program is by LCHE generation and collection of the generated electrons by the LS storage layer, in discrete traps in the nitride of an ONO storage element or in discrete potential wells of an OsnO or OBO storage element.

The erase is preferably a blanket operation using the TG to generate holes. In the typical erase operation, the channel (4x) of the source select gate (A2) is turned on by applying a voltage to the source select control poly-silicon (6x) with the source diffusion (2x) at ground potential. Similarly the channels (4p) of the select/program gates (C1 to C3) are all turned on by application of a voltage sufficient to turn the gates on to the inter-storage gate select/program gate poly-silicon (7p). The channel (4) of the drain select gate (A1) is kept in the off condition by grounding the drain select control poly-silicon (6) which isolate the drain diffusion (2) from the storage elements and makes the state of the drain diffusion a don't care condition during erase. This set-up allows the channel under the storage gates (B1 to B4) to be at ground potential. The erase operation is conducted on all the storage gates of the cell at the same time by application of suitable similar voltages. A voltage is applied to the collector electrodes (18) of the TG stack of the storage gates (B1 to B4) that are to be erased, to create a drift field for holes across the cell storage elements by having a potential difference across the storage elements, from the collector electrodes to the channels (8) of the storage gates. Typical voltage applied to the collector electrodes is sufficient to turn on the channel underneath the storage gate, which then connects to the source through the on channel of the source select gate and is hence kept at ground potential. The typical value of voltage applied to the collector electrodes is in the 1 to 3 V range. A voltage is now applied to the injector electrodes (20) of the TG stack of 5.0 to 8.5 V such that the potential is sufficient to cause tunneling of holes from the injectors (20) to the collector electrodes (18) through the thin barrier (19) separating them. Part of the holes, or charge carriers, that tunnel through the barrier will pass through the thin collector electrode forming the grid layers, which have a thickness less than the mean free path of the charge carrier in the collector electrode material, without collisions and with sufficient retained energy, to over come the potential barrier of the barrier layer (11) that is the top layer of the storage elements. Since a drift field exist in the storage elements between the collector electrode and the channel, the charge carriers or holes, that over come the potential barrier and enter the barrier layer (11) over laying the storage layer (10) will tend to drift down into the storage layer and get trapped in the discrete traps of the ONO or the discrete potential wells of the OsnO or the OBO storage layer that is used for the LS storage element. Any charge carriers that are not collected by the storage layer will drift through the gate dielectric layer (9) under the storage layer, forming the bottom protective barrier layer of the storage element and will be collected by the channel. Since the stored charge during erase is positive, the channels of the storage gates will be turned on after an erase, that is an erased state in the storage gate will make the gate conduct.

Figure 6:
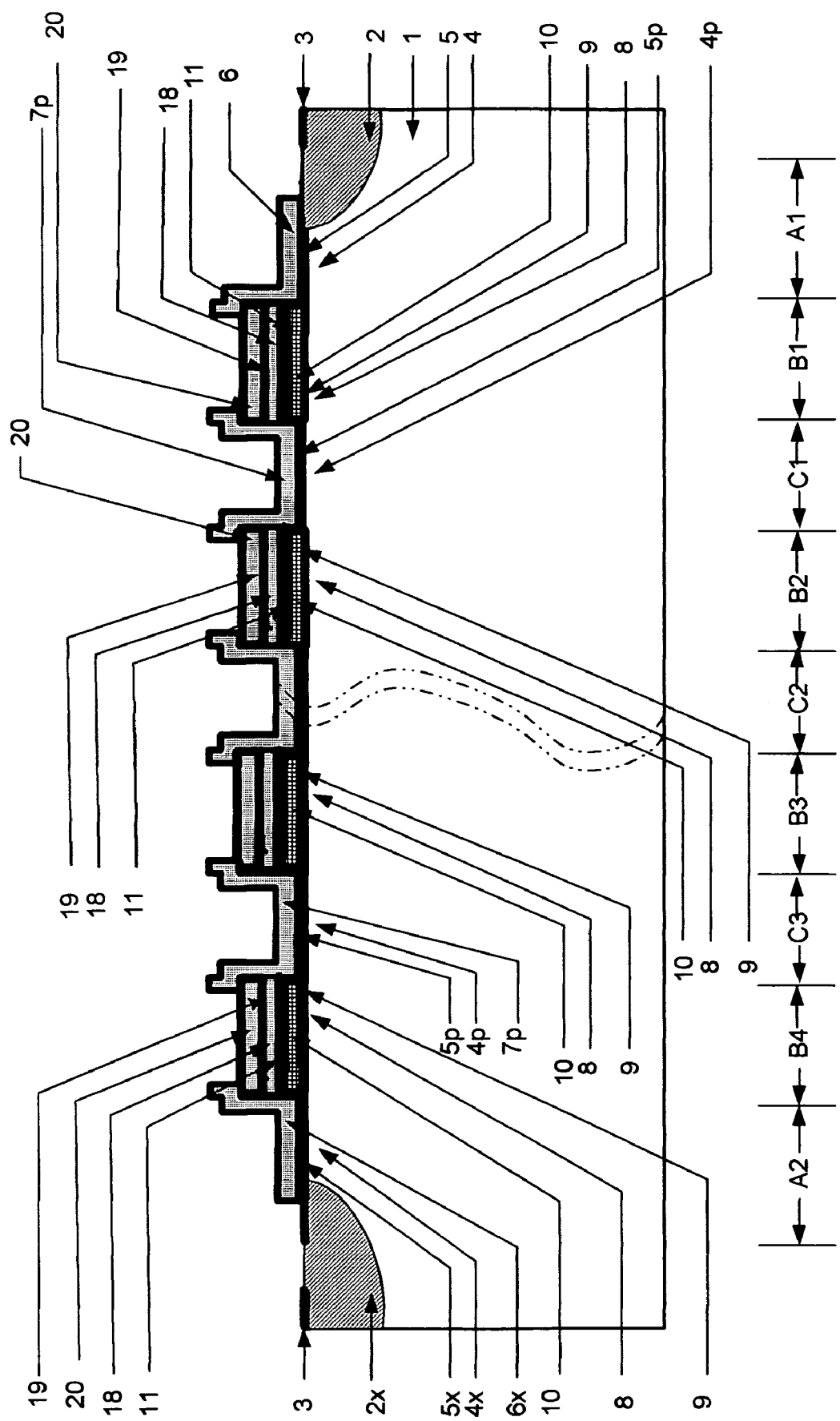
FIG. 6 LSN2 Cell (Location-Specific NAND Cell With LCHE Program and TG Erase)
1. P-well
2. Drain Diffusion
2x. Source Diffusion
3. Isolation oxide
4. Drain select gate channel
4x. Source select/program gate channel
4p. Inter-storage gate select/program gate channel
5. Drain select gate oxide
5x. Source select/program gate oxide
5p. Inter-storage gate select/program gate oxide
6. Drain select gate poly-silicon
6x. Source select/program gate poly-silicon
7p. Inter-storage gate (inter-gate) select/program gate poly-silicon 8. Channel under storage element
9. First Oxide, over the channel (8), of the Storage element
10. Storage layer (Nitride layer or Silicon-nodule layer or Buckyball layer)
11. Top protection barrier, or top barrier oxide, or second Oxide, on the surface of the storage layer (10)
18. Bottom conductive collector electrode or grid, of the TG stack and control gate electrode
19. Barrier layer of the TG structure
20. Top conductive layer forming the injector electrode of TG stack and top layer of the control gate
A1 and A2. Seletect Gates
B1, B2, B3, and B4. Storage gates
C1, C2, and C3. Select/Program gates
  Note: The conductive layers of the TG stack when kept at equal potential or shorted together act as the control gate electrode of the storage gate.

The main difference between the cells in FIG. 5 and FIG. 6 is the programming. In FIG. 6 the LCHE programming allows the cells to be programmed using reasonably lower peak voltages than the FN programming method used in the cell disclosed in FIG. 5. The LCHE method will cause a current to flow in the circuit and hence dissipate more programming power than the previous method.

Assuming that the storage gate (B2) is selected for there are two possibilities based on the date input. If the external Data input indicates that the location need to be programmed, the programming electrons will be generated which will be accumulated into the storage location to program the right data. If the external Data input indicates the opposite data type, that is the gate is to be left erased, there will be no programming electrons generated and the erased state of the cell is retained.

The programming operation for B2 is as follows: The channel (4x) of source select gate (A2) and the channel (4)

of drain select gate (A1) are turned on by application of suitable voltages typically in the 1 to 3V to the respective select gate poly-silicon (6*x* and 6). The channels of un-selected storage gates (B1, B3 and B4) are also turned on by application of a voltage to the control gate Poly-silicon (18 and 20 together), typically in the range of 1.5 to 3V. The channels (4*p*) of the un-selected select/program gates (C1 and C3) are also turned on by application of a suitable voltage to the inter-storage gate (inter-gate) select/program gate poly-silicon (7*p*). A voltage sufficient to just turn on the channel under the source side select/program gate (C2) adjacent to the selected storage gate (B2) is applied to the inter-gate select/program gate poly-silicon (7*p*) of the selected select/program gate (C2), typical voltage is in the range of 0.2 to 0.8V. A high voltage typically of 4 to 7V, sufficient to accelerate the carriers and collect them in the storage layer is applied to the control gate (18 and 20) of the selected storage gate (B2). The gates of this cell shown in FIG. 6 is programmed differently from the cell shown in FIG. 5 in that if the drain (2) is impressed with a voltage based on the input data of typically 1.5 to 4 V, then this drain voltage appears in the channel and a current flows from Drain to source. Since all the channels of gates except the select/program gate (C2) are in the fully turned on state, almost the full drain to source voltage applied across the integrated channel appears across the selected select/program gate (C2) where the current limit happens. This causes the carriers in the channel (4*p*) under the select/program gate (C2) to reach velocity saturation and cause impact ionization at the drain side of the channel of the select/program gate (C2) and the source side of the storage gate (B2), resulting in generation of hot electrons. A portion of these electrons having the right velocity component towards the storage gate are then accelerated towards the Barrier layer (9) under the storage layer of selected storage gate (B2) by the existing high voltage on the control gate of the gate (B2). These charge carriers will overcome the barrier and then be in the drift field generated by the voltage applied to the control gate poly-silicon (18 and 20) of the storage gate (B2). This field allows the carriers to move across and into the storage element and be collected in the discrete traps that exist in the Nitride storage layer (10) of the ONO storage element, or alternately be collected by the discrete potential wells of the silicon-nodule storage layer (10) of the OsnO storage layer or the Carbon Buckyball storage layer (10) of the OBO storage element used in the cell. This generation of negatively charged carriers and accumulation in the storage layer programs the cell. If the voltage impressed on the drain (2) is now 0V, there will be no current flow in the integrated channel and no voltage drop across the selected program/erase gate (C2). Hence no the LCHE hot carrier generation and collection by the storage gate (B2) and no change in the erase state of the cell.

This way the cells in FIG. 5 and FIG. 6 can be programmed one gate at a time based on the drain potential which will be based on input data and hence provided selective programming based on input data.

In the case of programming the storage gate B4 of the cell, the source select gate A2 will also act as the combined select/program gate and source select gate.

A major difference in the program operation is that the programming carriers are generated at the interface of the source side select/program gate and the storage gate, which result in the storage of programming charge in the storage element within 200 to 400A of the generation interface. If the LS storage element is larger in dimension then the rest of the discrete traps, or discrete potential wells spaced away from the carrier generation point will be in the erased state after programming. The fact that the storage is limited to the small area at the generation interface allow the cells to easily scale as technology scales to sizes as small as 400A in length.

Inverting the source and drain of the cell during programming and applying the correct voltages it is possible to program the drain side of the cell rather than the source side as will be easily understood by those who practice the art.

It is also possible by changing the polarity of voltages, as is well understood in the semiconductor industry, to easily use these programming and erase methods for a P-channel cell rather than the disclosed N-channel cell. The disclosures are hence not to be construed as a limitation on the method for the program-erase operation of the cells.

The typical read of both these LS NAND cells is simple. As with any other NAND cell a single storage gate in the cell read at a time. A positive read voltage is applied to the Drain of the cell. The cells to be read are selected by turning on both the Source Select and Drain select gates. All other gates except the selected storage gate in the cell is supplied with a voltage to turn on the gates (the voltage applied is made sufficient to fully turn on the erased storage cells). The selected cell is left with ground voltage on the control gate such that it will limit or shut off the current in the cell if it is in the programmed state and will allow a current flow if the cell is in the erased state, there by providing a read out of the data stored in the cell. It is possible to apply additional voltages; the read can be enhanced and speeded up as is well known to designers and practitioners of Non-Volatile memories.

The disclosed cells over come a number of problems with the current Location-Specific cells and provide the following advantages:

1. The use of TG method for erase allows the LS storage elements to be erased and programmed by independent methods that are de-coupled from each other.
2. The decoupling of program and erase by the TG method of erase enable efficient NAND cell architecture.
3. Reliable NAND erase and program are possible with the disclosed methods.
4. The higher voltages needed for erase are applied only to the TG stack and are not applied to the well or the junctions of the cell.
5. The only terminal that will see any high voltage during erase are the Tunnel Gun electrodes, or TG stack, which together form the control gate.
6. The disclosed Programming methods also reduce the overall voltages on the junctions and wells.
7. Over all reduction of high voltages applied to cell diffusions allow shrinking of the cell sizes.
8. Drain engineering for the programming and erase need not be simultaneously optimized.
9. Process complexity is reduced due to lower voltage operation and separation of Program and erase.
10. High-speed program and erase operation is possible.
11. TG erase has the ability to inject either types of carriers, electrons or holes, into the floating storage node depending on the type of device and the associated voltages for future program development.
12. Memories can be implemented as either N-channel or P-channel cells.
13. The lower voltages in the system enable use of higher speed devices in the decode circuits.
14. Smaller storage element allows photolithographic scaling of cells to next generations.

15. Process steps are those currently in use and do not need to be developed uniquely for the cell.
16. TG stack processing can be easily integrated into the semiconductor process.
17. Power dissipation is reduced, as both program and erase are lower power and lower current operations.
18. The scaled cells enable large arrays to be implemented for data storage.
19. Self-limiting nature of the Program and erase can be used for implementing multilevel cells.
20. The cells are made highly manufacturable due to the reduction of specialized process steps that impact the silicon device characteristics.
21. The cells are manufacturable also due to simpler optimization needs and lower junction voltages applied to the device junctions.
22. The reduced high voltage enable use of higher speed designs by reducing the use of slow high voltage devices in the data path.
23. The cell architecture with select gates eliminates the necessity to ensure that the cells do not over erase, causing unselected cells to conduct during read, make the circuit design simple and manufacturable.

What is claimed is:

1. A Location-Specific NAND memory cell that can be programmed and erased, comprising
 a drain diffusion;
 a source diffusion; and
 a set of gates comprising
  a drain select gate;
  a source select gate; and
  multiple storage gates;
each storage gate having a Tunnel Gun stack over laying a storage element, the gates being separated by and interlinked by inter-gate diffusions, where the storage gate is erased by use of positive charge carriers injected using the Tunnel Gun.

2. The Location-Specific NAND memory cell in claim 1, where in the storage gates comprise an ONO storage element.

3. The Location-Specific NAND memory cell, in claim 1, where in the storage gates comprise an OsnO storage element.

4. The Location-Specific NAND memory cell, in claim 1, where in the storage gates comprise an OBO storage element.

5. The Location-Specific NAND memory cell, in claim 1, where in the Tunnel Gun stack comprise:
 i. a grid collector layer;
 ii. a barrier layer;
 iii. an injector layer.

6. A Location-Specific NAND memory cell, comprising
 a drain diffusion;
 a source diffusion; and
 a set of gates comprising
  a drain select gate;
  a source select gate; and
  multiple storage gates;
each storage gate having a Tunnel Gun stack over laying a storage element, the gates being separated by and interlinked by inter-gate diffusions, where the storage gate is erased by use of positive charge carriers injected using the Tunnel Gun and the storage gates of the cell are selectively programmed by FN tunneling from the substrate.

7. The Location-Specific NAND memory cell in claim 4, where in the storage gates comprise an ONO storage element.

8. The Location-Specific NAND memory cell, in claim 5, where in the storage gates comprise an OsnO storage element.

9. The Location-Specific NAND memory cell, in claim 5, where in the storage gates comprise an OBO storage element.

10. The Location-Specific NAND memory cell, in claim 5, where in the programming by FN tunneling is by application of high voltage to injector and grid collector of the tunnel Gun structure simultaneously.

11. A Location-Specific NAND memory cell comprising
 a drain diffusion;
 a source diffusion; and
 a set of gates comprising
  a drain select gate, adjacent the drain diffusion;
  a source select gate, adjacent the source diffusion;
  multiple storage gates; and
  multiple inter-storage gate select/program gates;
each storage gate having a Tunnel Gun stack over laying a storage element, the storage gates being separated from each other by the inter-storage gate select/program gates, where in the cell is erased by use of the positive charge carriers injected into it by the Tunnel Gun and the storage gates of the cell are selectively programmed by use of Low Current Hot Electron Programming.

12. The Location-Specific NAND memory cell in claim 11, where in the storage gates comprise an ONO storage element.

13. The Location-Specific NAND memory cell, in claim 11, where in the storage gates comprise an OsnO storage element.

14. The Location-Specific NAND memory cell, in claim 11, where in the storage gates comprise an OBO storage element.

15. The Location-Specific NAND memory cell, that is erased by use of a Tunnel Gun Stack and programmed by use of Low Current Hot Electron Programming, in claim 11 wherein, the programming is by generation of carriers by impact ionization in the channel, at a location, suitable for collection and storage by the selected Location-Specific storage element using the inter-storage gate select/program gate.

* * * * *